US008212351B1

(12) United States Patent
Debar et al.

(10) Patent No.: US 8,212,351 B1
(45) Date of Patent: Jul. 3, 2012

(54) STRUCTURE FOR ENCAPSULATING MICROELECTRONIC DEVICES

(75) Inventors: Michael J Debar, Huntington Beach, CA (US); David J Howard, Irvine, CA (US); Daniel M. So, Escondido, CA (US)

(73) Assignee: Newport Fab, LLC, Newport Beach, CA (US)

( * ) Notice: Subject to any disclaimer, the term of this patent is extended or adjusted under 35 U.S.C. 154(b) by 525 days.

(21) Appl. No.: 11/542,088

(22) Filed: Oct. 2, 2006

(51) Int. Cl.
*H01L 23/12* (2006.01)
(52) U.S. Cl. .......................................... 257/704; 257/787
(58) Field of Classification Search .................. 257/678, 257/682, 704, 721, 787–796; 438/121–124, 438/125–127
See application file for complete search history.

(56) References Cited

U.S. PATENT DOCUMENTS

| 3,673,309 | A | * | 6/1972 | Dalmasso | 174/554 |
| 2004/0126953 | A1 | * | 7/2004 | Cheung | 438/200 |
| 2005/0048757 | A1 | * | 3/2005 | Aigner et al. | 438/614 |

* cited by examiner

*Primary Examiner* — Kiesha Bryant
*Assistant Examiner* — Tucker Wright
(74) *Attorney, Agent, or Firm* — Farjami & Farjami LLP

(57) ABSTRACT

According to an embodiment disclosed herein, a microelectronic device to be encapsulated is built on, or alternatively in, a substrate. The device is then coated with a sacrificial layer. A lid layer is deposited over the sacrificial layer, and then appropriately perforated to optimize the removal of the sacrificial layer. The sacrificial layer is then removed using one of several etching or other processes. The perforations in the lid layer are then sealed using a viscous sealing material, thereby fixing the environment that encapsulates the device. The sealing material is then cured or hardened. An optional moisture barrier may be deposited over the cured sealing layer to provide further protection for the encapsulation if needed.

13 Claims, 11 Drawing Sheets

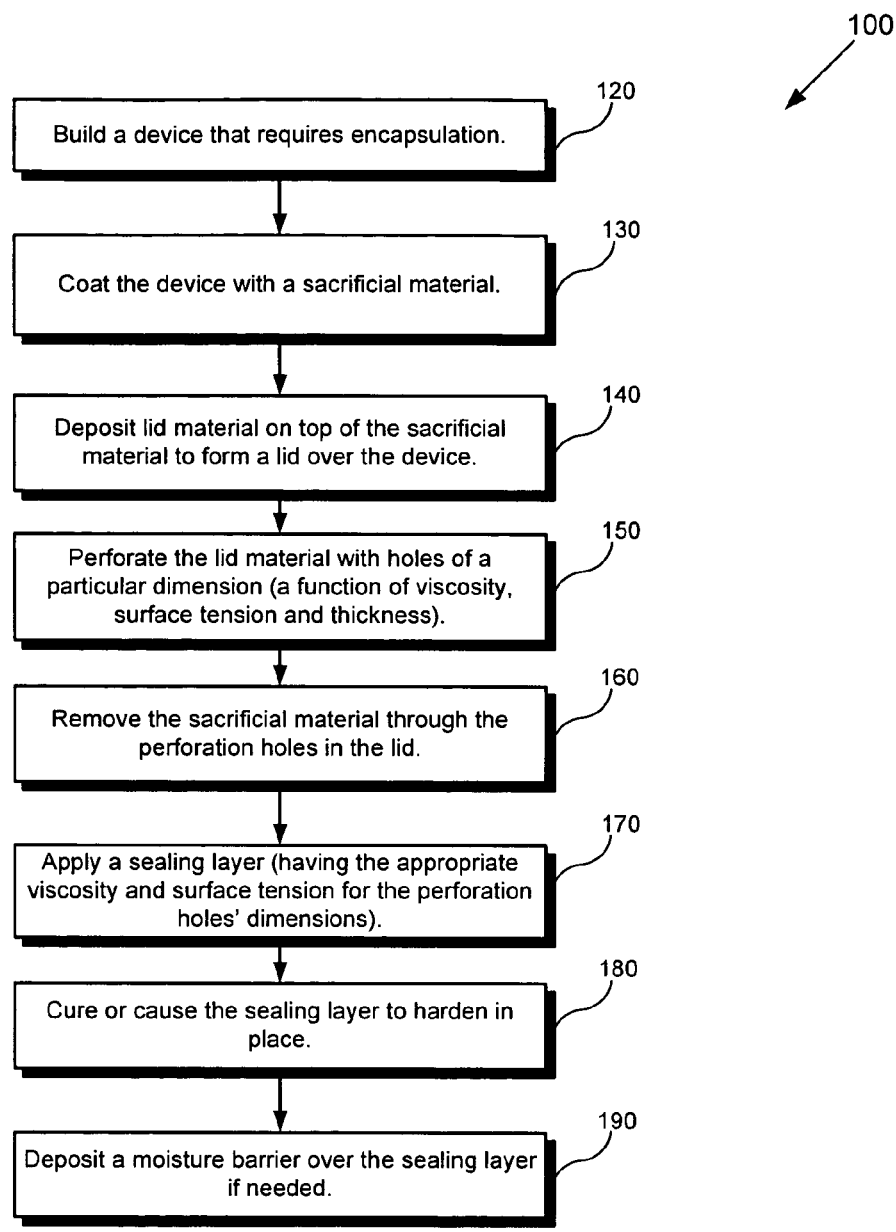

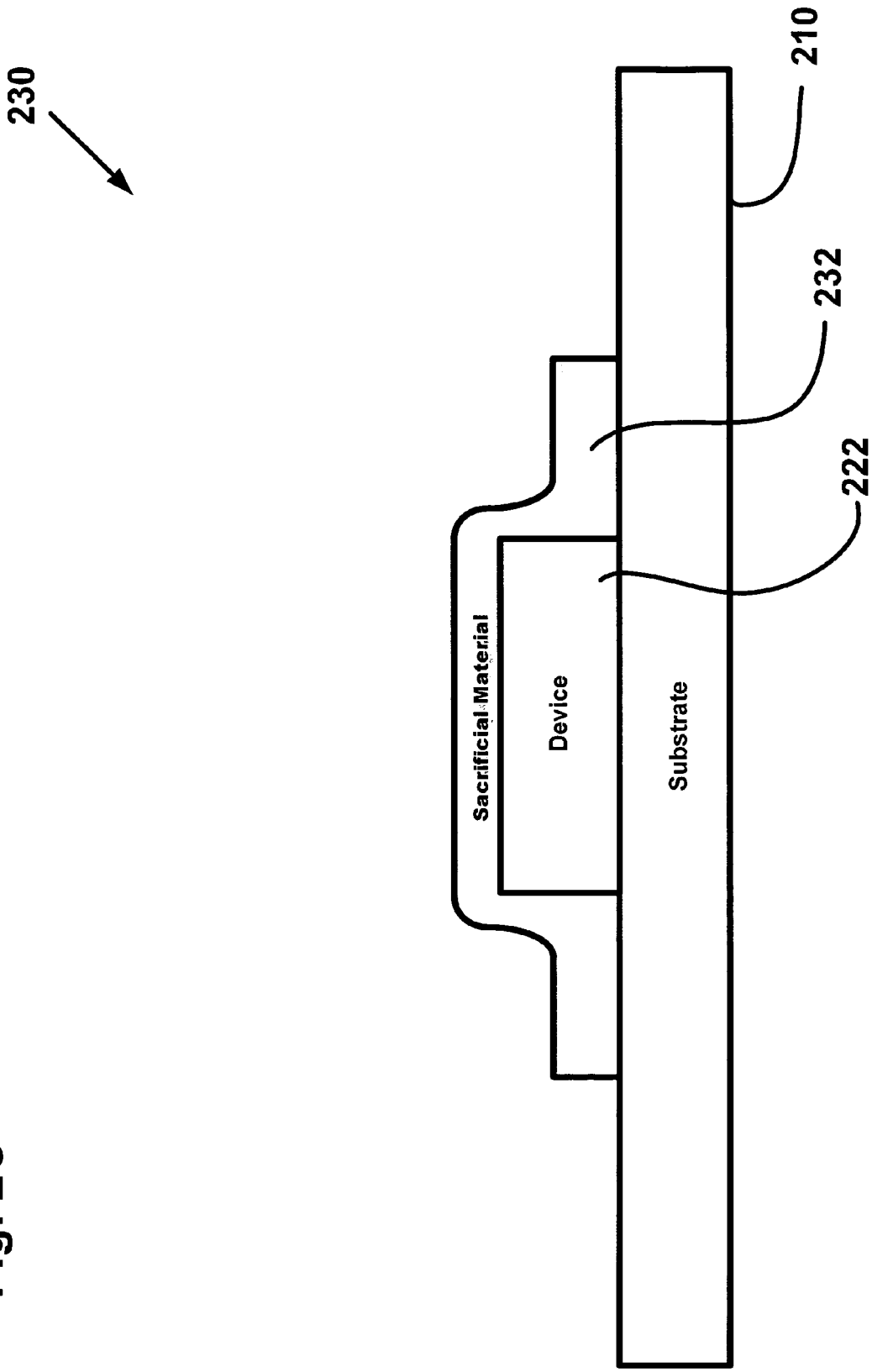

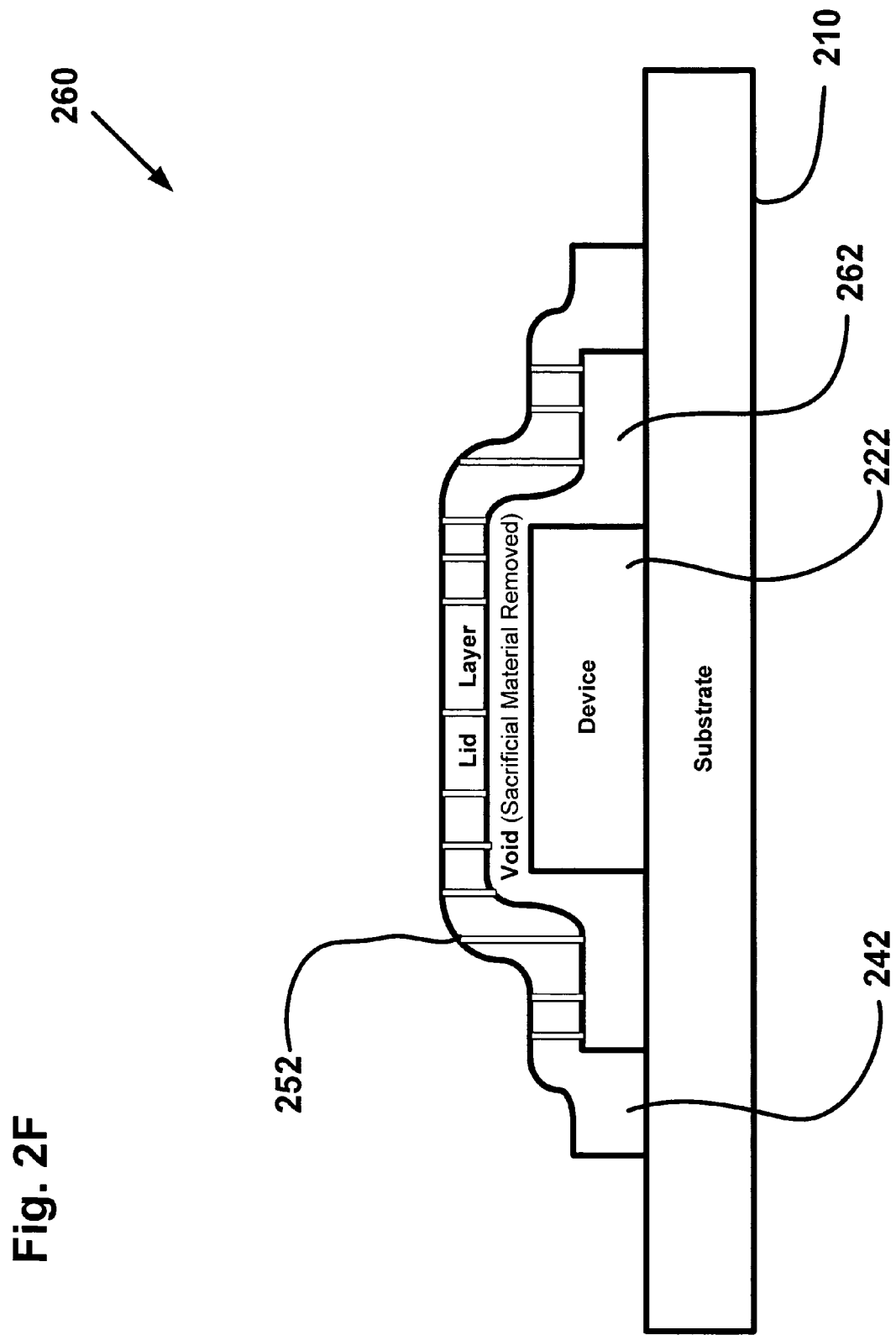

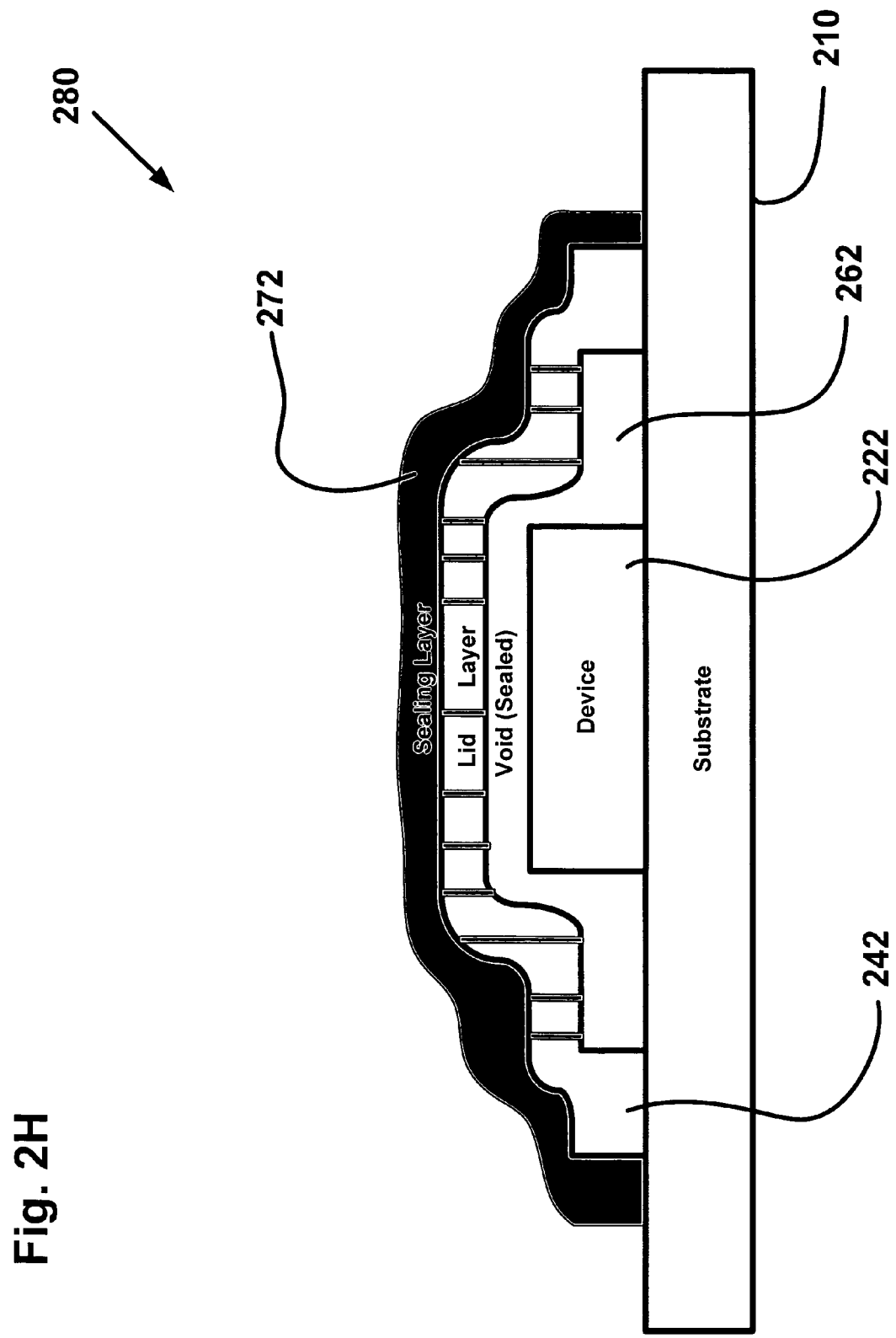

STRUCTURE FOR ENCAPSULATING MICROELECTRONIC DEVICES

BACKGROUND OF THE INVENTION

1. Field of the Invention

The present invention is generally in the field of fabrication of microelectronic devices. More particularly, the invention is in the field of packaging microelectronic devices.

2. Background Art

Microelectronic devices, such as various types of semiconductor integrated circuits (ICs), micro-electro-mechanical systems (MEMS), nano-electro-mechanical systems (NEMS), radio frequency CMOS systems (RFCMOS), and micro-optical-electro-mechanical systems (MOEMS), are often separately packaged to protect the microelectronic devices from mechanical damage, chemical attack, light, extreme temperature cycles, electro-magnetic interference and other environmental effects.

Traditional packaging methods also provide mechanical support for the packaged device and facilitate handling of the device for subsequent attachment to a board or substrate. If desired, the package may also provide heat dissipation for the device. Although microelectronic packages may include a variety of forms to perform various functions, in general, the package includes a support to receive the device and encapsulating material to surround and protect the device from the surrounding environment.

Traditional methods of encapsulating such microelectronic devices are performed individually on each separate device, whereby the microelectronic device is mechanically adhered and electrically connected to a board or substrate. One commonly practiced method for such encapsulations is to adhesively attach the device to the pad of a leadframe, and forming electrical contacts between the device and the leads of the leadframe by wire bonding. The leadframe may then be mechanically attached and electrically coupled to the substrate by soldering the leads of the leadframe to the substrate.

Encapsulating methods and structures are generally configured to surround the microelectronic device, the wire bonds connecting the device to the leadframe, and a portion of the leadframe, leaving at least a portion of the leads exposed to the surrounding environment. The non-encapsulated lead portion is free to connect the packaged device to the board or substrate.

A drawback of employing traditional encapsulation processes such as those described above is that encapsulation is performed on each microelectronic device individually. Disadvantages include excessive time, labor, cost and scrap. Moreover, encapsulated microelectronic devices require separate packaging and assembly before they can be incorporated into a circuit, resulting in larger overall physical dimensions of such circuits.

SUMMARY OF THE INVENTION

The present invention is directed to structure and method for encapsulating microelectronic devices. The present application discloses an efficient and effective method and structure for encapsulating microelectronic devices that require physical isolation. Such devices require encapsulation for any number of reasons, including to shield from one or more types of interferences or to protect the device from physical or mechanical forces. Devices that require encapsulation include, without limitation, general integrated circuits (ICs), micro-electro-mechanical systems (MEMS), nano-electro-mechanical systems (NEMS), radio frequency CMOS systems (RFCMOS), and micro-optical-electro-mechanical systems (MOEMS). Significantly, the method disclosed herein enables formation of encapsulation layers during fabrication—at the wafer level—thereby reducing cost, time and complexity of manufacturing semiconductor devices that employ encapsulated devices by eliminating the need to individually attach separate lids for each encapsulated device.

According to an embodiment disclosed herein, a microelectronic device to be encapsulated is built on, or alternatively in, a substrate. The device is then coated with a sacrificial layer. A lid layer is deposited over the sacrificial layer, and then appropriately perforated to optimize the removal of the sacrificial layer. The sacrificial layer is then removed using one of several etching or other processes. The perforations in the lid layer are then sealed using a viscous sealing material, thereby fixing the environment that encapsulates the device. The sealing material is then cured or hardened. An optional moisture barrier may be deposited over the cured sealing layer to provide further protection for the encapsulation if needed.

Other features and advantages of the present invention will become more readily apparent to those of ordinary skill in the art after reviewing the following detailed description and accompanying drawings.

BRIEF DESCRIPTION OF THE DRAWINGS

FIG. 1 is a flowchart illustrating the steps taken to implement an embodiment of the present invention.

FIG. 2C illustrates a portion of the wafer processed in accordance with an intermediate step in the flow chart of FIG. 1 in accordance with one embodiment of the invention.

FIG. 2F illustrates a portion of the wafer processed in accordance with an intermediate step in the flow chart of FIG. 1 in accordance with one embodiment of the invention.

FIG. 2H illustrates a portion of the wafer processed in accordance with an intermediate step in the flow chart of FIG. 1 in accordance with one embodiment of the invention.

DETAILED DESCRIPTION OF THE INVENTION

The present invention is directed to structure and method for encapsulating microelectronic devices. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

FIG. 1 shows flowchart 100, which describes the steps, according to one embodiment disclosed herein, in the processing of a wafer that includes devices that require encapsulation. Certain details and features have been left out of flowchart 100 that are apparent to a person of ordinary skill in the art. For example, a step may comprise one or more substeps or may involve specialized equipment or materials, as is known in the art.

Figure 2A:
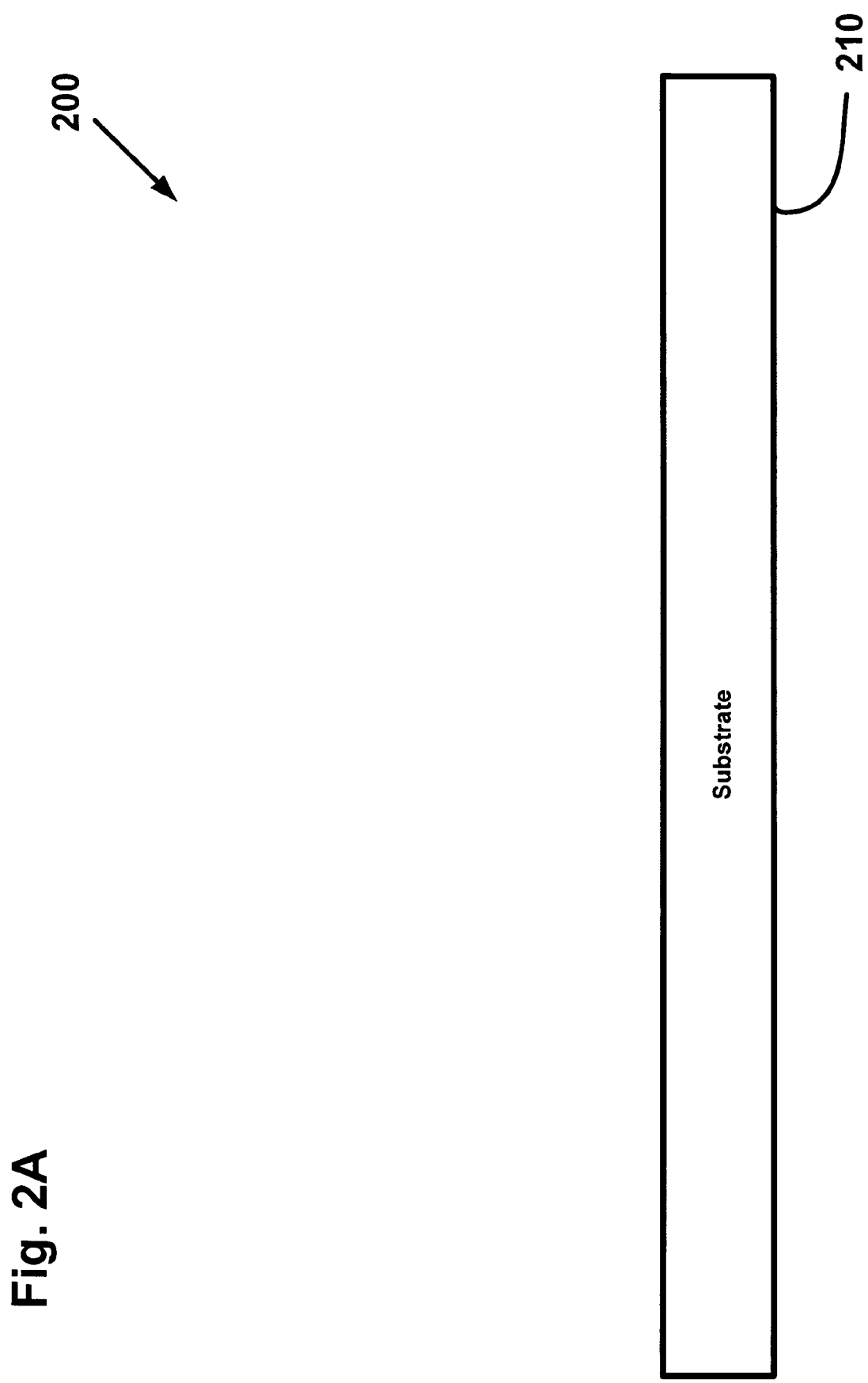
FIG. 2A is a cross-sectional view of a portion of a wafer comprising a substrate.

While steps 120 through 190 indicated in flowchart 100 are sufficient to describe one embodiment disclosed herein, other embodiments disclosed herein may use steps different from those shown in flowchart 100. It is noted that the processing steps shown in flowchart 100 are performed on portion 200 of a wafer, which, prior to step 120, comprises substrate 210, shown in FIG. 2A.

Figure 2B:
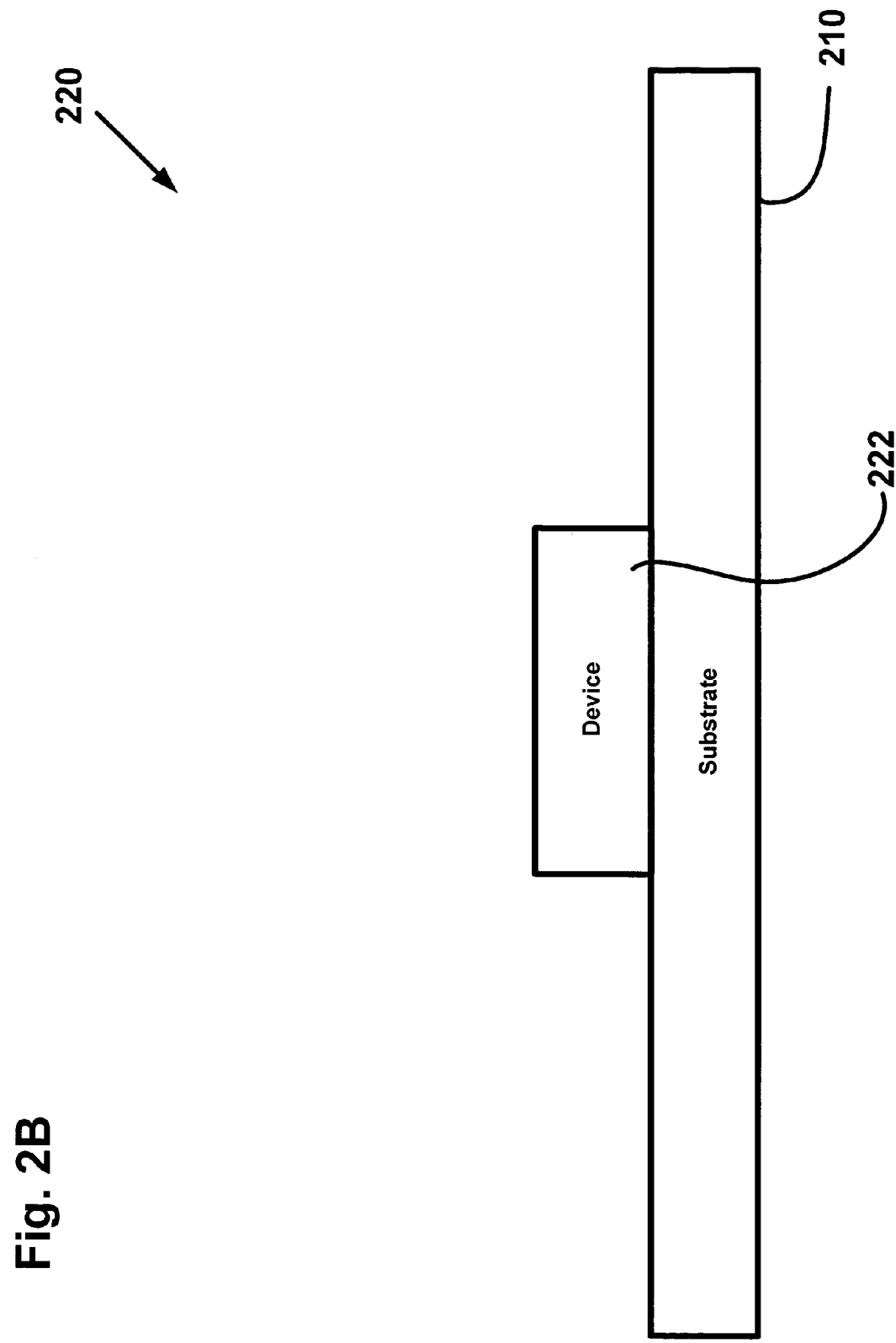
FIG. 2B illustrates a portion of the wafer processed in accordance with an initial step in the flow chart of FIG. 1 in accordance with one embodiment of the invention.

FIG. 2B shows portion 220 of a wafer processed in accordance to step 120 of flowchart 100 of FIG. 1 in which a device 222 is formed on or attached to substrate 210. Device 222 depicts a generic device formed on or attached to the surface of substrate 210 in manners well known to one skilled in the art. Device 222 can be an integral part of the substrate 210 and may comprise single or multiple layers. Device 222 may perform any type of function and may be made using any process for fabricating semiconductor devices. Specific examples of devices that may comprise device 222 include, without limitation, general semiconductor integrated circuits, micro-electro-mechanical systems (MEMS), nano-electro-mechanical systems (NEMS), radio frequency CMOS systems (RFCMOS), and micro-optical-electro-mechanical systems (MOEMS).

A characteristic of device 222 is that it requires encapsulation, creating a physical barrier surrounding the device 222. Reasons for encapsulating the device 222 include, without limitation, protecting the device 222 from mechanical damage, chemical attack, light, extreme temperature cycles, electro-magnetic interference, mechanical forces and other environmental effects. Accordingly, the fabrication process disclosed herein is well suited for encapsulating devices that require a cavity and devices that employ moving parts, for example MEMS, because such moving parts require environmental isolation to ensure that their motion is not disrupted by friction or corrosion, or dampened by physical contact with other components of the semiconductor integrated circuit.

FIG. 2C illustrates schematically portion 230 of a wafer processed corresponding to step 130 of flowchart 100 of FIG. 1 in which sacrificial layer 232 is deposited over device 222. Sacrificial layer 232, once removed, will form void 262 (void 262 is shown, for example, in FIG. 2F below) that surrounds the device 222. Sacrificial layer 232, therefore, is required only to surround one or more devices 222 located on or in substrate 210. Accordingly, sacrificial layer 232 is deposited using a patterning process such that substrate 222 is exposed in areas where devices 222 are not located. Patterned deposition of sacrificial layer 232 is important because subsequent layers to be deposited will require area on the substrate on which to establish contact.

Figure 2D:
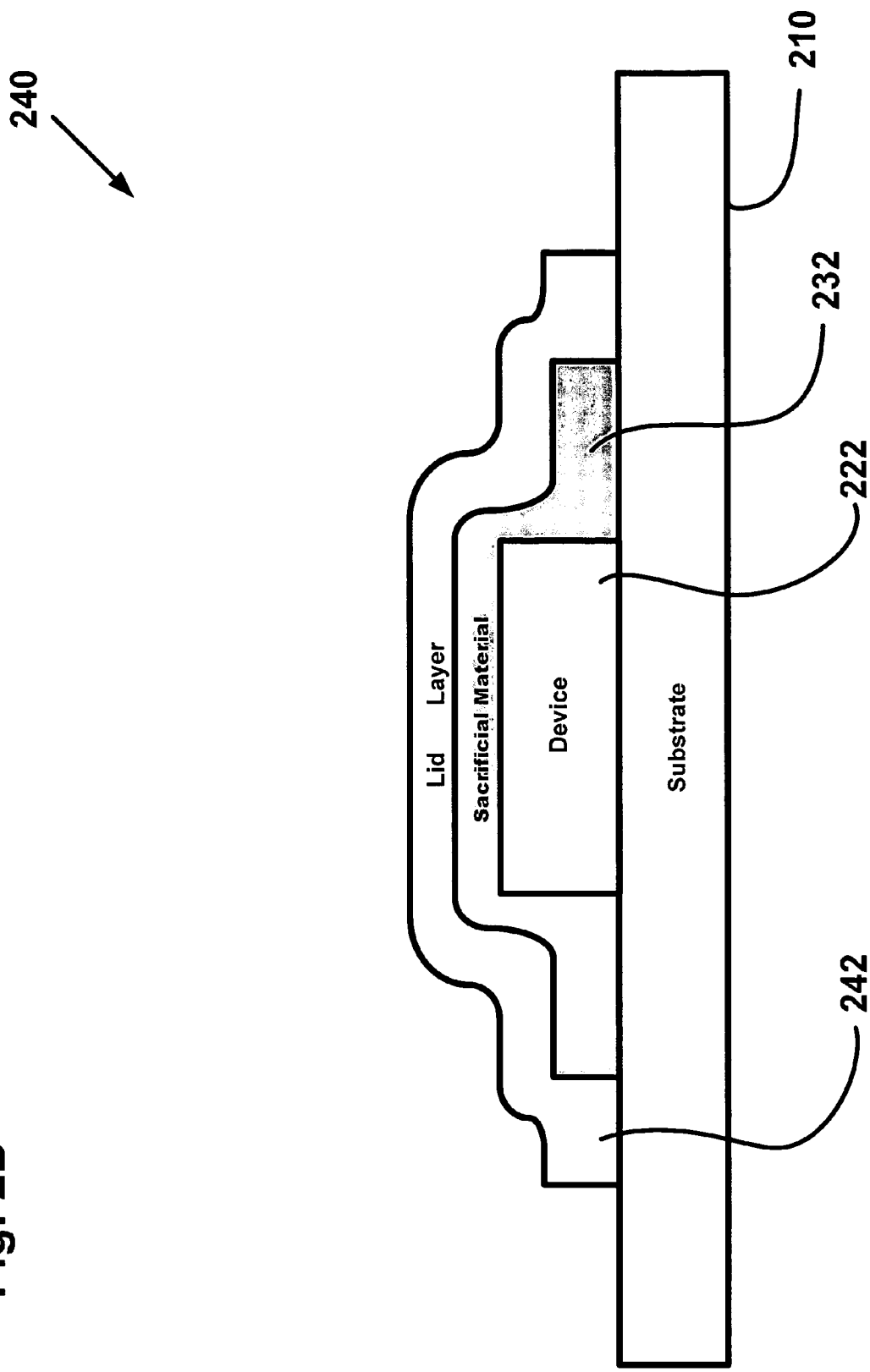
FIG. 2D illustrates a portion of the wafer processed in accordance with an intermediate step in the flow chart of FIG. 1 in accordance with one embodiment of the invention.

Material suitable for sacrificial layer 232 has the characteristic of being easily removed in a subsequent step of the process without harming device 222 or lid 242 (lid 242 that is deposited over the sacrificial layer in the next step of the process is show in, for example, FIG. 2D). Examples of materials that are suitable for use in sacrificial layer 232 include, without limitation, polyimides and silicon oxide. Sacrificial layer 232 may be deposited by a conformal process or by a planar process. Examples of methods for depositing sacrificial layer 232 include, without limitation, chemical vapor deposition ("CVD"), spin-on coating and sputtered coating processes.

Sacrificial layer 232 must be sufficiently thick such that lid layer 242 (FIG. 2D) does not come into physical proximity with device 222, so as to avoid direct contact between lid layer 242 and device 222 once the device is sealed. Specific dimensions of sacrificial layer 232 depend on the effective width of perforations 252 made in lid layer 242 (perforations 252 are shown, for example, in FIG. 2E), the viscosity of the sealing material used in sealing layer 272 (sealing layer 272 is shown, for example, in FIG. 2G), and the surface tension of the material comprising sealing layer 272 as the material seals perforations 252 in lid layer 242. Based on current practices in one embodiment, a minimum thickness of 2.0 microns is needed to meet such requirements; however, as geometries in semiconductor fabrication change, the minimum dimensions will change accordingly.

FIG. 2D illustrates schematically portion 240 of a wafer processed corresponding to step 140 of flowchart 100 of FIG. 1 in which lid layer 242 is deposited over sacrificial layer 232. Lid layer 242 encloses sacrificial layer 232 on all sides to form a hermetic seal between substrate 210 and lid layer 242. Material comprising lid layer 242 must be strong enough to avoid being removed during the removal of sacrificial layer 232 when it (i.e. sacrificial layer 232) is removed to form void 262 (void 262 is shown, for example, in FIG. 2F below). Material comprising lid layer 242 must also be strong enough to resist damage under typical loads, including those involved in wafer dicing and die-level assembly. Materials suitable for lid layer 242 include materials that are similar to those used for the outer most layers of semiconductor devices. Examples of such materials include, without limitation, oxides, nitrides, and other dielectrics, polysilicon, and even certain metals. Dimensionally, lid layer 242 must be separated from device 222 a distance greater than the effective width of perforations 252 that will be made in lid layer 242 (perforations 252 are shown, for example, in FIG. 2E).

Figure 2E:
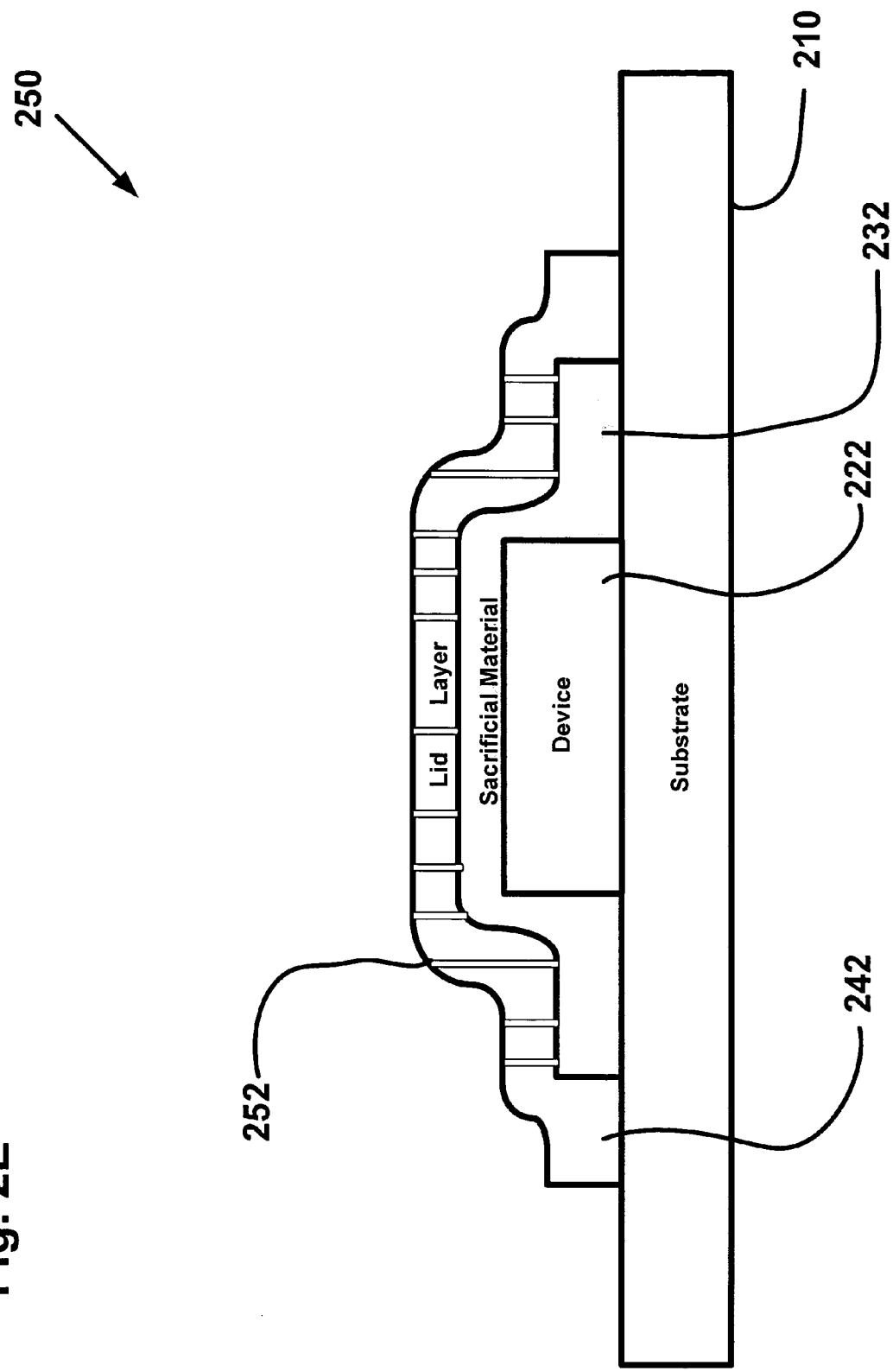
FIG. 2E illustrates a portion of the wafer processed in accordance with an intermediate step in the flow chart of FIG. 1 in accordance with one embodiment of the invention.

FIG. 2E illustrates schematically portion 250 of a wafer processed corresponding to step 150 of flowchart 100 of FIG. 1 in which lid layer 242 is perforated with perforations 252 to access sacrificial layer 232. Perforations 252 may be of any shape including, without limitation, circular, square, and rectangle.

The effective width of perforation 252 is critical in this step of the process. As described in more detail below, perforations 252 are used to remove sacrificial layer 232 and are then sealed with sealing layer 272 (sealing layer 272 is shown, for example, in FIG. 2G). During the sealing step, sealing layer 272 will fill perforations 252 with a sealing material. The dimensions of perforations 252 are calculated to promote wicking of sealing layer 272 into the perforations to ensure that perforations 252 are adequately sealed. The dimensions of perforations 252 are also calculated to provide sufficient surface tension to ensure that the sealing material does not drip out of perforations 252 through void 262 (void 262 is shown, for example, in FIG. 2F below) and onto device 222. Specifically, the surface tension created by the dimensions of perforations 252 in conjunction with the viscosity of the material used in sealing layer 272 enable the sealing material to fill perforations 252 and to bulge out of the distal end of perforations 252 without dripping on device 222.

Perforations 252 having relatively small diameters (if circles) or diagonals (if squares or rectangles) are optimized for both wicking and surface tension characteristics. Based on current geometries in one embodiment, perforations 252 having diameters or diagonals in a range between 0.25 microns and 5.0 microns have been effective, depending on the materials used and the dimensions of the structures involved; however, as geometries in semiconductor fabrication practice change, the range of appropriate dimensions for perforation 252 will change accordingly.

Perforations 252 are typically formed using dry etching processes so as to avoid affecting sacrificial layer 232. Dry etch processes also achieve the desired result of etching relatively parallel side walls extending down the length of perforations 252, through lid layer 242. Generally parallel walls ensure wicking of the sealing material into perforations 252 and ensure adequate surface tension of the sealing material at the distal end of perforations 252 to ensure that the sealing material does not drip out the end of perforations 252, through void 262 (void 262 is shown, for example, in FIG. 2F below) and onto device 222.

The number and density of perforations 252 required depend on the specific dimensions of the structures to be fabricated. In one embodiment, perforations 252 would be spaced no more than 10.0 microns apart to ensure that sacrificial layer 232 could be sufficiently accessed and removed through perforations 252. There is a substantially direct relationship between the number and density of perforations 252 and the length of time required to remove sacrificial layer 232. The closer the perforations are to each other, the faster the removal of sacrificial layer 232 will be accomplished. However, the structural integrity of lid layer 242 must also be taken into consideration, as having too many perforations 252 in lid layer 242 could affect the ability of lid layer 242 to effectively encapsulate device 222 and resist damage under typical loads, including those involved in wafer dicing and die-level assembly.

FIG. 2F illustrates schematically portion 260 of a wafer processed corresponding to step 160 of flowchart 100 of FIG. 1, in which sacrificial layer 232 is removed to form void 262. Any standard removal process may be used to remove sacrificial layer 232. One example of such a process is either wet or dry isotropic etching, in which an isotropic plasma or vapor is used to etch away the sacrificial material. If sacrificial layer 232 comprises an organic material, such as a polyimide, then an oxygen plasma etch is one process known to be effective for removing sacrificial layer 232. If sacrificial layer 232 comprises an inorganic oxide, then a fluoride based etchant, such as a hydrofluoric acid vapor ("HF") etchant, is known to work well to remove sacrificial layer 232. If device 222 to be encapsulated comprises moving parts, such as with certain MEMS devices, then a dry etch process would be advantageous so as to avoid potential sources of residue from a wet etch that can cause problems, such as causing "stiction" (i.e. static friction) of the moving parts of the MEMS device.

Figure 2G:
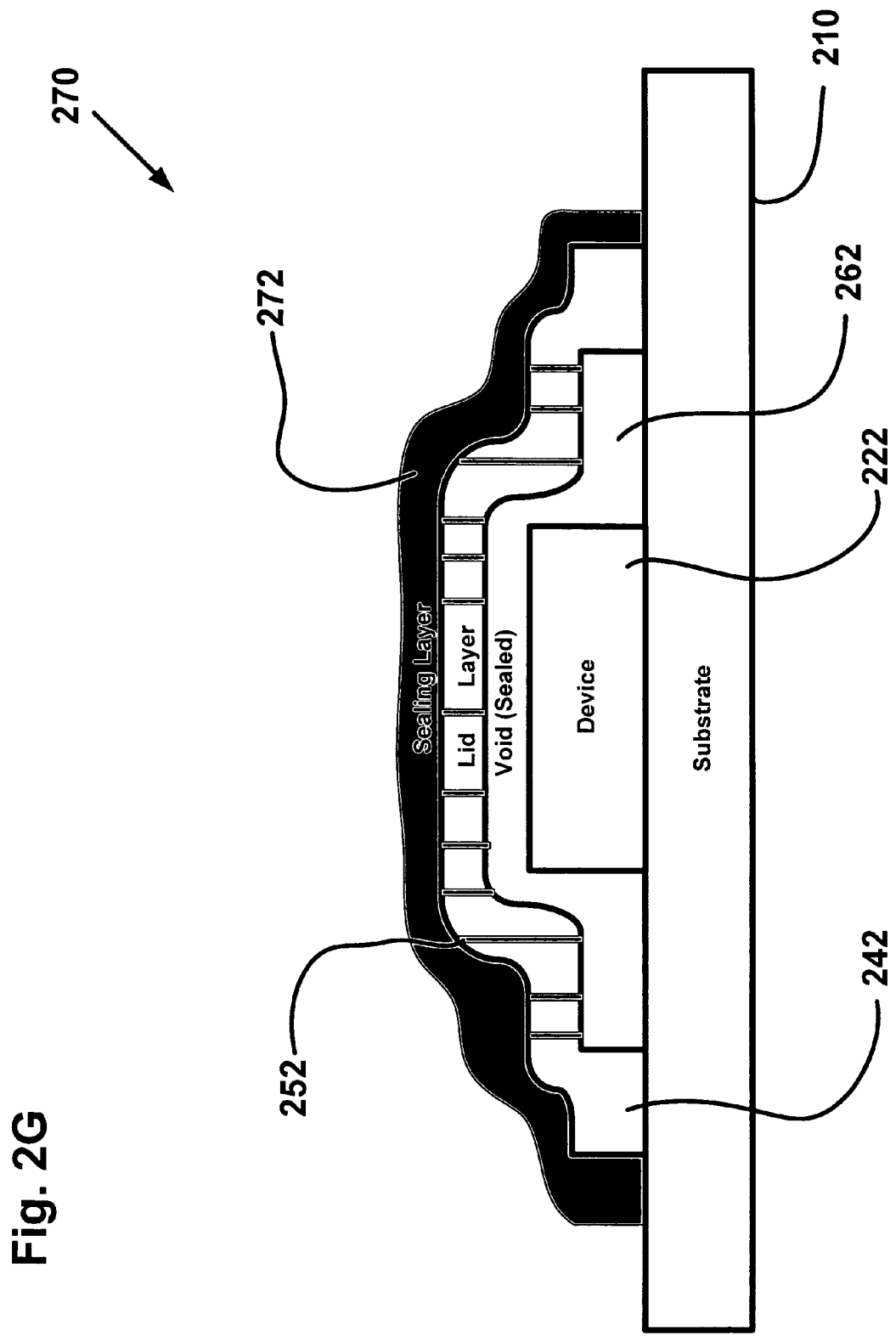
FIG. 2G illustrates a portion of the wafer processed in accordance with an intermediate step in the flow chart of FIG. 1 in accordance with one embodiment of the invention.

FIG. 2G illustrates schematically portion 270 of a wafer processed corresponding to step 170 of flowchart 100 of FIG. 1 in which lid layer 242 and perforations 252 are sealed with sealing layer 272. Sealing layer 272 comprises a material that will have the appropriate viscosity to wick into perforations 252 in lid layer 242 but will not bead out of the bottom ends of perforations 252 onto device 222. Sealing layer 272 may be applied using a spin-on method or a "photo deposition" method, among others methods known to those skilled in the art. A polyimide or any other viscous liquid that can be cured in place may be used for sealing layer 272. Sealing layer 272 may be a planar or a conformal layer, depending on the requirements of the semiconductor device being fabricated.

FIG. 2H illustrates schematically portion 280 of a wafer processed corresponding to step 180 of flowchart 100 of FIG. 1 in which sealing layer 272 is cured. Curing of the material used in sealing layer 272 can be performed by any method, so long as sealing layer 272 is cured in place. Examples of such curing methods include, without limitation, curing by heat (oven), by ultraviolet radiation, by infrared radiation, or by allowing sealing layer 272 material to harden in place at room temperature.

Figure 2I:
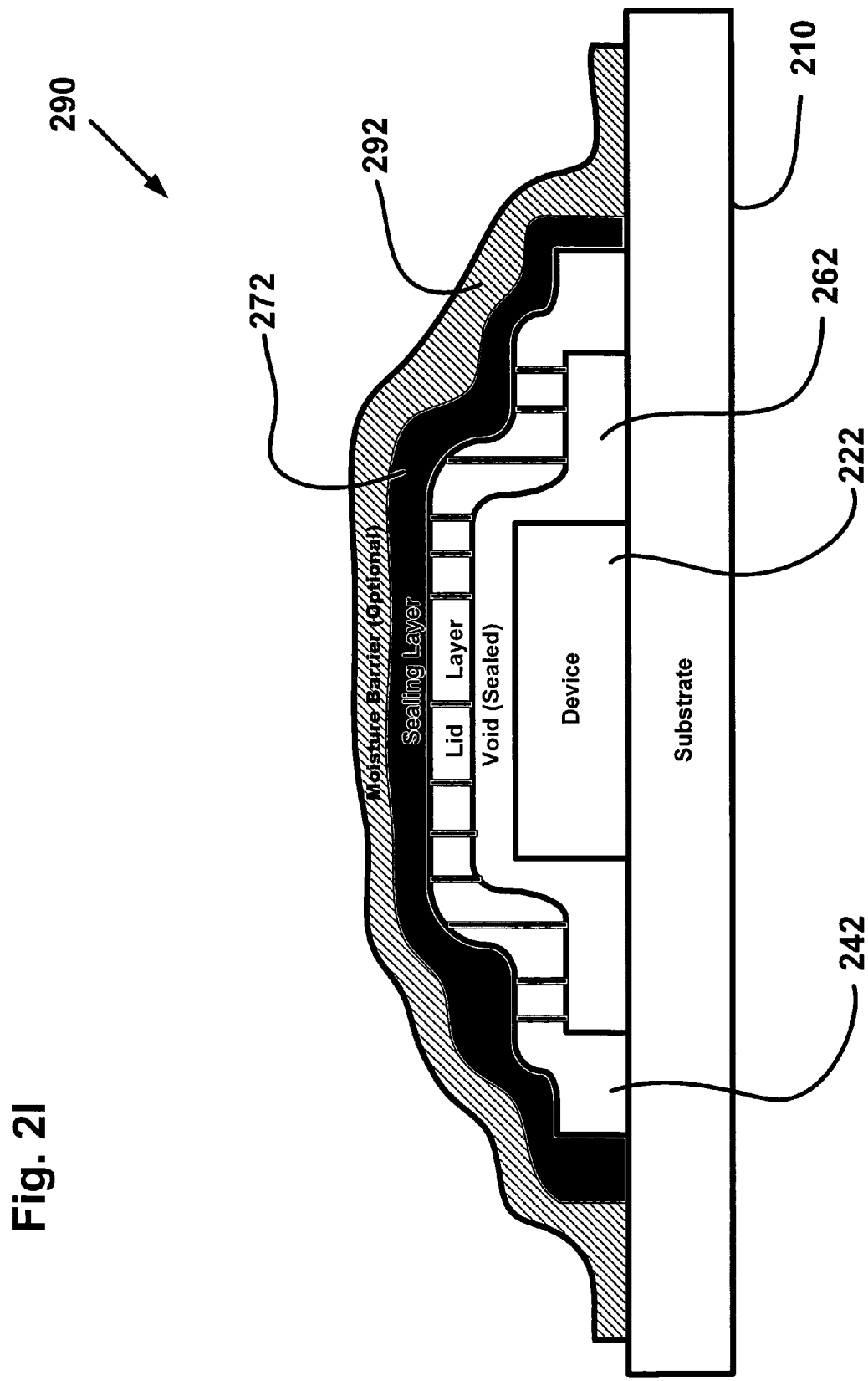
FIG. 2I illustrates a portion of the wafer processed in accordance with a final step in the flow chart of FIG. 1 in accordance with one embodiment of the invention.

FIG. 2I illustrates schematically portion 290 of a wafer processed corresponding to step 190 of flowchart 100 of FIG. 1 in which an optional moisture barrier 292 is applied. Optional moisture barrier 292 may comprise a standard dielectric overcoat as is known to one skilled in the art. The moisture barrier, while optional, is applied to increase reliability of the semiconductor device being fabricated and in one embodiment forms a hermetic seal with substrate 210. Typical materials used for optional moisture barrier 292 include, without limitation, oxynitride, silicon nitride, and silicon oxynitride. Thickness of optional moisture barrier 292 can range from 0.5 microns to 2.0 or more microns. Methods of depositing optional moisture barrier 292 include, without limitation, conformal deposition by a CVD process.

Figure 3:
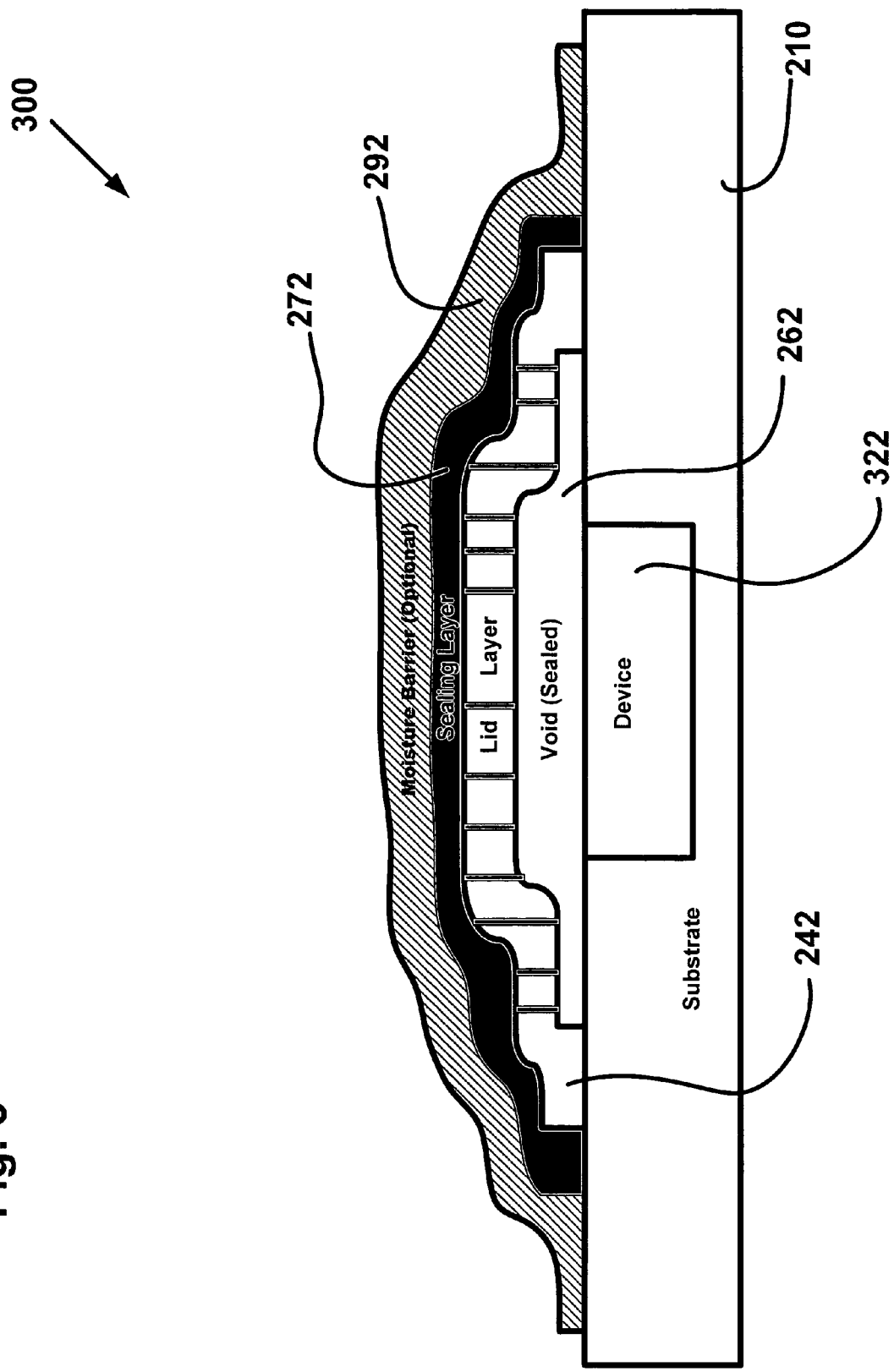
FIG. 3 illustrates a cross-sectional view of an alternative embodiment of the invention.

FIG. 3 illustrates schematically portion 300 of a wafer processed according to an alternative embodiment in which device 322 to be encapsulated is positioned within substrate 210, instead of over substrate 210. In this embodiment, a difference between device 322 and device 222 used as an example above is that device 322 is positioned in a trench in substrate 210. In this embodiment, the process described above for encapsulating device 222 can be followed. While device 322 is illustrated as being flush with the upper surface of substrate 210, one skilled in the art would appreciate that device 322 may be either flush or below the surface level of substrate 210.

The above description is directed to a method for encapsulating devices while achieving improved manufacturability and reliability by providing a wafer level method of encapsulation of devices in cavities where the environment within the cavity is non-solid, for example comprises a gas or is a complete void (i.e. a vacuum). Although the invention is described as applied to encapsulation of a device on a wafer, it will be readily apparent to a person of ordinary skill in the art that the disclosed method can be generally applied to similar situations where improved manufacturability and reliability is desirable by efficiently and effectively packaging semiconductor or microelectronic devices in cavities where the environment within the cavity is non-solid, for example comprises a gas or is a complete void (i.e. a vacuum).

From the description above, it is evident that various techniques can be used for implementing the concepts of the disclosed method herein without departing from its scope and spirit. Moreover, while the method and the devices made using the method have been described with specific reference to certain embodiments, a person of ordinary skills in the art would recognize that changes may be made in form and detail without departing from the spirit and scope of the disclosure herein. The described embodiments are to be considered in all respects as illustrative and not restrictive. Therefore, it should be understood that the invention as claimed is are not limited to the particular embodiments described herein, but is capable of many rearrangements, modifications, and substitutions without departing from its scope as disclosed herein.

Thus, structure and method for encapsulating microelectronic devices have been described.

The invention claimed is:

1. A structure comprising:
  a microelectronic device formed on or within a substrate, wherein said microelectronic device has one surface in physical contact with said substrate and one surface exposed from said substrate;
  a lid including a plurality of sealed perforations, said lid enclosing a cavity surrounding said microelectronic device surface exposed from said substrate and said lid separated from said microelectronic device by a distance greater than a width of said sealed perforations;
  a sealing layer encompassing said lid on all sides and attached to said substrate; and
  a moisture barrier encompassing said sealing layer.

2. The structure of claim 1 wherein said lid forms a seal at locations where said lid is attached to said substrate.

3. The structure of claim 2 wherein said seal is hermetic.

4. The structure of claim 1 wherein said sealing layer forms a seal at locations where said sealing layer is attached to said substrate.

5. The structure of claim 1 wherein said moisture barrier is further attached to one side of said substrate.

6. The structure of claim 5 wherein said moisture barrier forms a hermetic seal with said substrate.

7. The structure of claim 1 wherein said device has only one surface in physical contact with said substrate.

8. An encapsulation structure comprising:
  a microelectronic device formed on or within a substrate, wherein said microelectronic device has one surface in physical contact with said substrate;
  a lid encapsulating said microelectronic device, wherein said lid encloses a cavity surrounding said microelectronic device;
  a sealing layer encompassing said lid on all sides and attached to said substrate, wherein said lid further comprises a plurality of sealed perforations and is separated from said microelectronic device by a distance greater than a width of said sealed perforations; and
  a moisture barrier encompassing said sealing layer.

9. The encapsulation structure of claim 8 wherein said lid forms a seal at locations where said lid is attached to said substrate.

10. The encapsulation structure of claim 9 wherein said seal is hermetic.

11. The encapsulation structure of claim 8 wherein said sealing layer forms a seal at locations where said sealing layer is attached to said substrate.

12. The encapsulation structure of claim 8 wherein said moisture barrier is further attached to one side of said substrate.

13. The encapsulation structure of claim 12 wherein said moisture barrier forms a hermetic seal with said substrate.

* * * * *